United States Patent
Oishi

(10) Patent No.: US 7,629,846 B2
(45) Date of Patent: Dec. 8, 2009

(54) SOURCE FOLLOWER CIRCUIT AND SEMICONDUCTOR APPARATUS

(75) Inventor: Kazuaki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/940,421

(22) Filed: Nov. 15, 2007

(65) Prior Publication Data

US 2008/0197926 A1    Aug. 21, 2008

(30) Foreign Application Priority Data

Feb. 16, 2007    (JP)    ............... 2007-036169

(51) Int. Cl.
*H03F 3/45* (2006.01)
(52) U.S. Cl. .................................. 330/253
(58) Field of Classification Search .................. 330/253
See application file for complete search history.

(56) References Cited

U.S. PATENT DOCUMENTS 6,727,757 B1 *    4/2004    Venkatraman et al. ...... 330/259

FOREIGN PATENT DOCUMENTS

JP    8-228115    9/1996

* cited by examiner

*Primary Examiner*—Robert Pascal
*Assistant Examiner*—Khiem D Nguyen
(74) *Attorney, Agent, or Firm*—Katten Muchin Rosenman LLP

(57)    ABSTRACT

Based on a result of comparing an output common mode direct-current voltage of a pair of source follower transistors when a direct-current voltage is applied to each gate of the pair of source follower transistors with a predetermined reference voltage, the direct-current voltage is controlled such that the output common mode direct-current voltage can match the reference voltage.

19 Claims, 6 Drawing Sheets

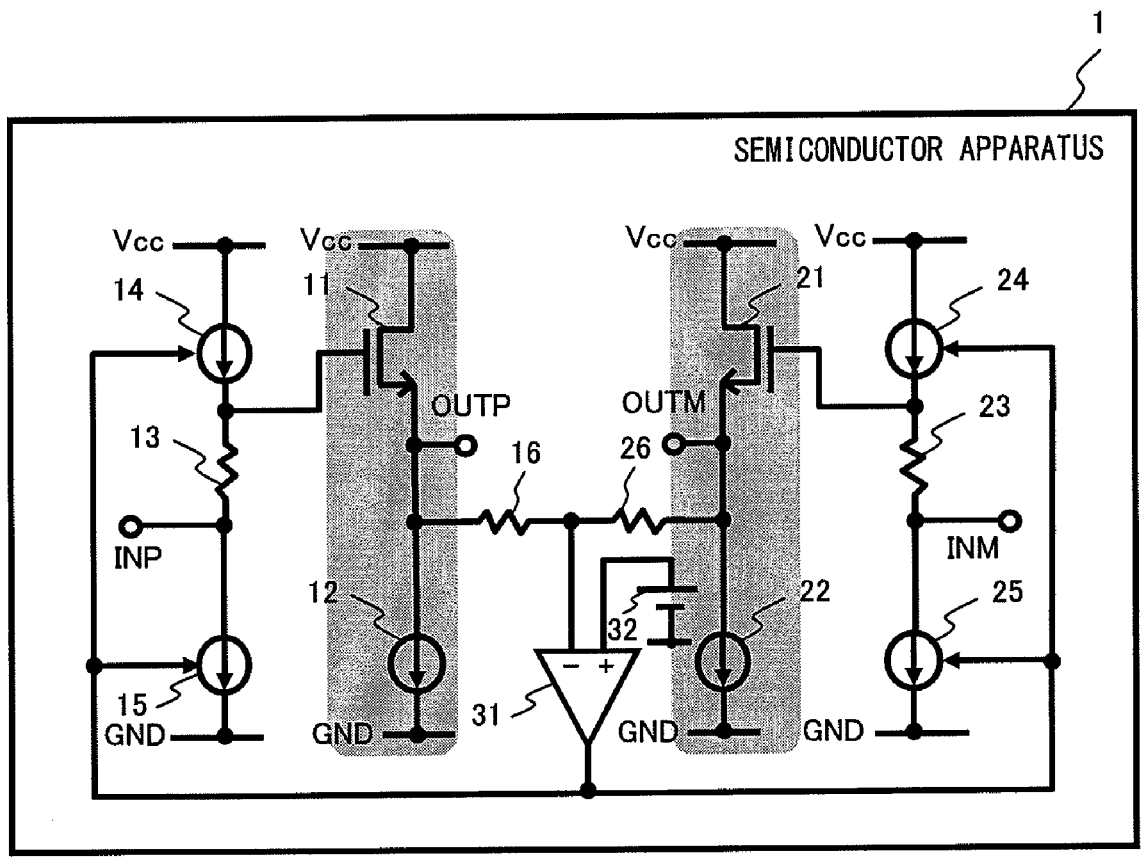
F I G. 2

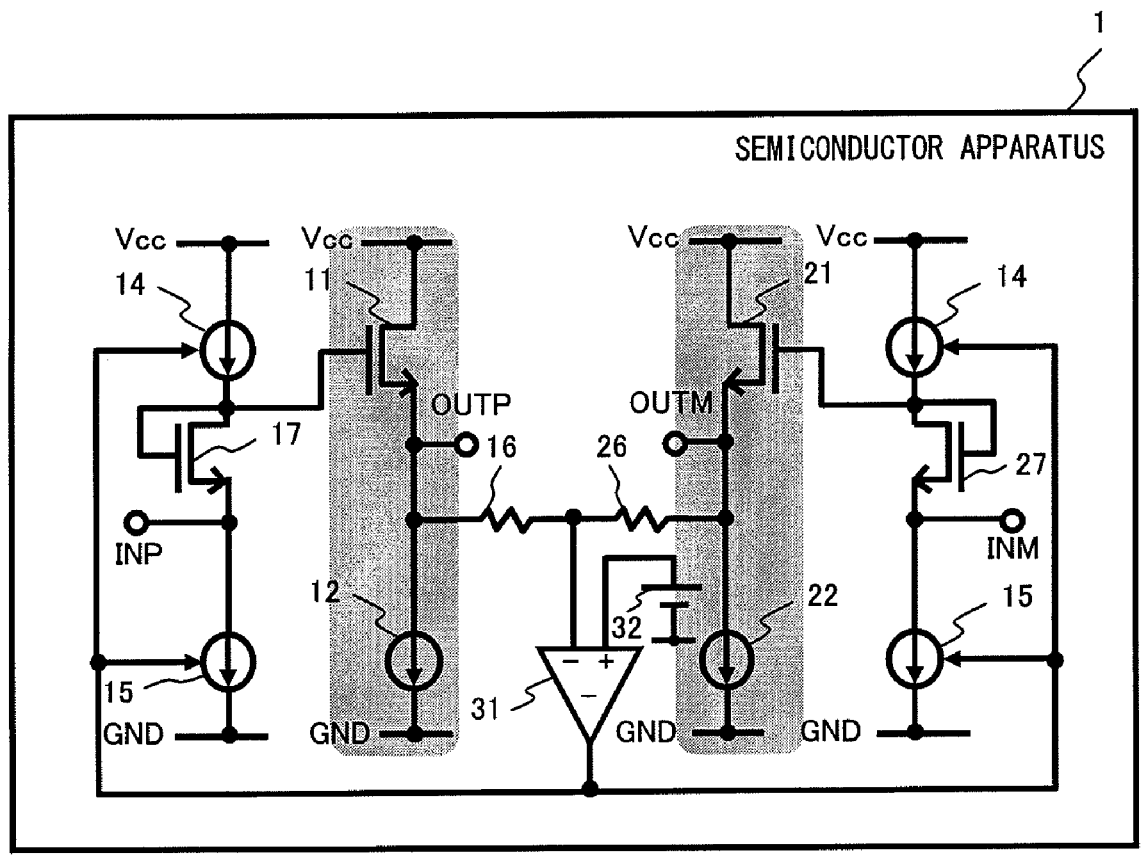
F I G. 3

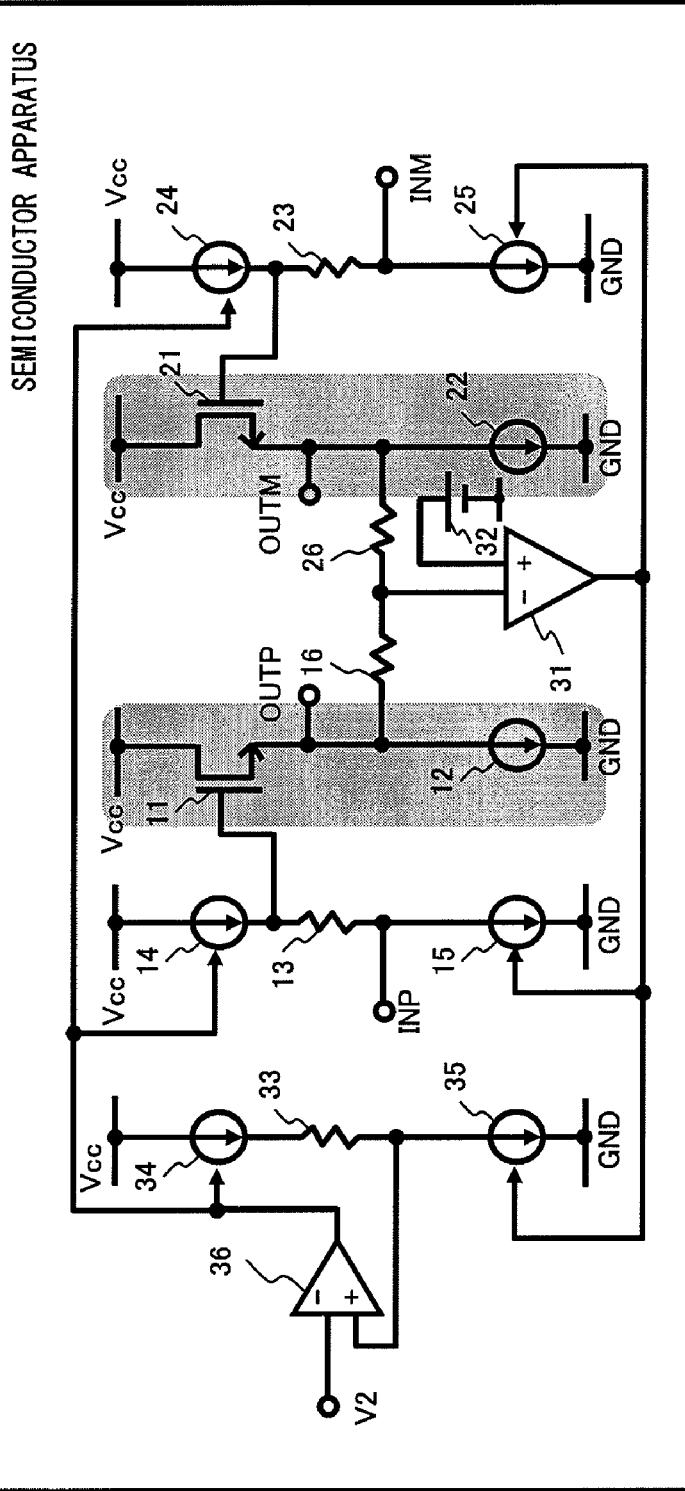
F I G. 4

From OPAMP31

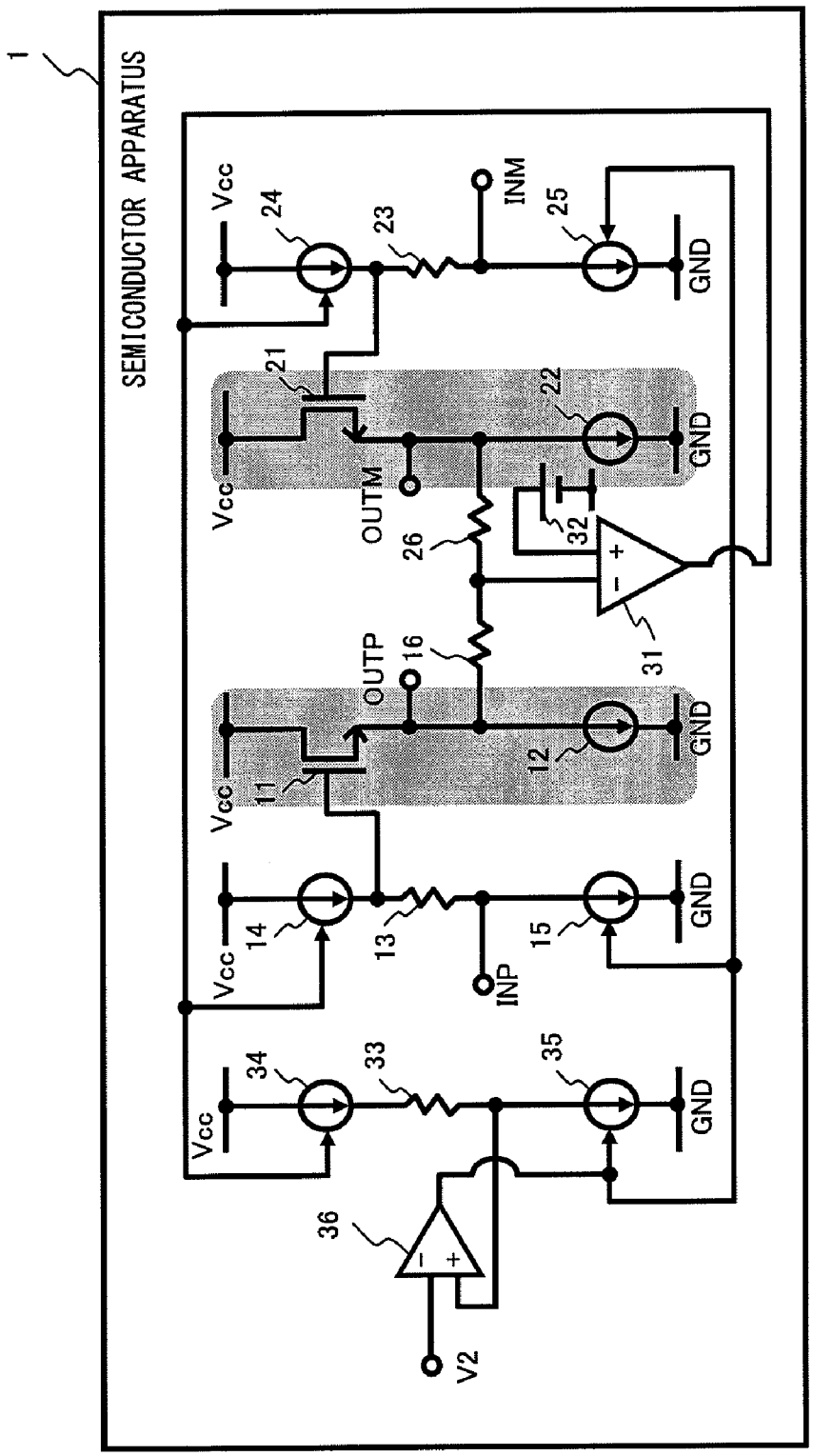
F I G. 6

SOURCE FOLLOWER CIRCUIT AND SEMICONDUCTOR APPARATUS

BACKGROUND OF THE INVENTION

1. Field of the Invention

The present invention relates to the technology of a differential signal circuit, and more specifically to the technology of stabilizing an output common mode direct-current voltage.

2. Description of the Related Art

An analog IC (integrated circuit) for outputting an analog signal of a high frequency (for example, several tens of megahertz) is considered. Since a substrate for implementing the IC or a following circuit to which the IC outputs a signal has a large capacitance, it is necessary to provide a high-speed and high driving capability buffer amplifier at the final stage of signal output.

The buffer amplifier can be an operational amplifier. However, when an operational amplifier is used, it is necessary to guarantee a sufficient phase margin by passing a large current to an operational amplifier to suppress an oscillation caused by a large load capacity connected to a subsequent stage. That is, when an operational amplifier is used as a buffer amplifier, the current consumption of the IC becomes large.

Under the circumstances, a source follower can be used as a high-speed and high load driving capability buffer amplifier with small current consumption.

FIG. 1 shows an example of a circuit of a source follower.

In FIG. 1, a transistor 101 is an NMOS transistor, and its drain is connected to the power line (voltage Vcc) of the circuit. The source of the transistor 101 is connected to the ground line (reference potential GND) of the circuit through a current source 102, and a load 103 is connected to a point between the connection point between the source of the transistor 101 as the output of the circuit and the current source 102, and the ground line of the circuit.

The input voltage Vi and the output voltage Vo of the circuit shown in FIG. 1 has the relationship expressed by the following equation.

$$Vo = Vi - Vgs = Vi - \left(\sqrt{\frac{2Id}{\beta}} + Vth\right)$$

In the equation above, Vgs indicates the voltage between the gate and the source of the transistor 101, Id indicates the drain current of the transistor 101, $\beta$ indicates a physical parameter of the transistor 101, and Vth indicates the threshold voltage of the transistor 101.

Since the transistor 101 has the threshold voltage Vth that largely depends on the production condition and the operation temperature condition (for example, ±0.2 volt), the voltage level of the direct-current component of the output of the source follower shown in FIG. 1 is not stable. Therefore, there has been the problem that a source follower cannot be used as a buffer amplifier when it is necessary to have a direct-current component at a stable voltage level in the circuit at a subsequent stage.

Relating to the present invention, for example, Japanese Published Unexamined Patent Application No. H8-228115 discloses the technology of matching a common mode output signal with a reference common mode input signal with high accuracy in a differential amplification circuit having a common mode feedback.

SUMMARY OF THE INVENTION

The present invention aims at providing a source follower circuit having a stable voltage level of the direct-current voltage component of output.

The source follower circuit as one of the aspects of the present invention includes: a pair of source follower transistors; a voltage apply unit applying a direct-current voltage to each gate of the pair of source follower transistors; and a control unit controlling an applied voltage to each gate of the pair of source follower transistors by the voltage apply unit based on a result of comparing an output common mode direct-current voltage of the pair of source follower transistors and a predetermined reference voltage so as to match the output common mode direct-current voltage with the reference voltage.

With the configuration, the output common mode direct-current voltages of a pair of source follower transistors are monitored, and a negative feedback is applied such that the output common mode direct-current voltages can match the predetermined reference voltage. Therefore, the voltage level (output common mode direct-current voltage in this case) of the direct-current component can be stable.

In the source follower circuit according to the present invention described above, the control unit can include a comparison circuit for comparing the output common mode direct-current voltage with the reference voltage, and can control the applied voltage based on a comparison result by the comparison circuit.

With the configuration, the control unit can control to match the output common mode direct-current voltage with the reference voltage.

In the source follower circuit according to the above-mentioned present invention, the voltage apply unit can include: a pair of resistors respectively connected to gates of the pair of source follower transistors and having same resistance values; and a pair of current sources passing the same amount of current, and the control unit can control the amount of current to be passed by the pair of current sources to the pair of resistors respectively.

With the configuration, the voltage apply unit can control the applied voltage to each gate of the pair of source follower transistors.

At this time, each of the pair of resistors can be configured by a transistor. The transistor and the pair of source follower transistors can be formed on a single semiconductor substrate.

With the configuration, the same production condition and operation temperature condition can be applied to the transistors as the pair of resistors and the pair of source follower transistors. Therefore, as a combination of the behaviors of the fluctuation of a drain current caused by these conditions, the operation of the circuit can be more stable.

In the source follower circuit according to the present invention, the pair of current sources can include: a pair of first current sources passing the same amount of current; and a pair of second current sources passing the same amount of current; each of the pair of first current sources can be connected to a connection point between each gate of the pair of source follower transistors and the pair of resistors; each of the pair of second current sources can be connected each of the pair of resistors on an opposite side of a connection of the pair of first current sources; and the control unit can control an amount of current to be passed by each of the first and second current sources.

With the configuration, the applied voltage to each gate of the pair of source follower transistors can be controlled by the voltage apply unit. Therefore, the output common mode direct-current voltage can be stable.

At this time, the control unit can include a first comparison circuit for comparing the output common mode direct-current voltage and the reference voltage, and can control an amount of current passed by the second current source based on a comparison result by the first comparison circuit; and the control unit can further include a secondary control unit for controlling an amount of current passed by the first current source so as to match the amount of current passed by the first current source with the amount of current passed by the second current source.

With the configuration, the amount of current passed by the first current source matches the amount of current passed by the second current source, thereby preventing a current from passing to and from a circuit at a preceding stage from which the source follower circuit receives a signal.

At this time, a differential signal can be input to the source follower circuit, and the differential signal can be input to each of a connection point between the pair of resistors and second current sources; the secondary control unit can include: a first secondary current source for passing the same amount of current as the pair of first current sources; a second secondary current source for passing the same amount of current as the pair of second current sources based on a comparison result by the first comparison circuit; a detection resistor having the same resistance value as the pair of resistors, and having the first and second secondary current sources connected to either end; and a second comparison circuit comparing a detection voltage generated at a connection point between the detection resistor and the second secondary current source by passing current by the first and second secondary current sources with a predetermined detection reference voltage, and the amounts of current of the first secondary current source and the pair of first current sources can be controlled such that the detection voltage can match the predetermined detection reference voltage based on a comparison result by the second comparison circuit.

With the configuration, the amount of current passed by the first current source can match the amount of current passed by the second current source.

Furthermore, in the source follower circuit according to the present invention, the control unit can include a first comparison circuit for comparing the output common mode direct-current voltage and the reference voltage, and can control an amount of current passed by the first current source based on a comparison result by the first comparison circuit; and the control unit can further include a secondary control unit for controlling an amount of current passed by the second current source so as to match the amount of current passed by the second current source with the amount of current passed by the first current source.

With the configuration, the amount of current passed by the second current source can match the amount of current passed by the first current source, thereby preventing the current from passing to and from the circuit at the preceding stage from which the source follower circuit receives a signal.

At this time, a differential signal can be input to the source follower circuit, the differential signal can be input to each of a connection point between the pair of resistors and second current sources, the secondary control unit can include: a first secondary current source for passing the same amount of current as the pair of first current sources based on a comparison result by the first comparison circuit; a second secondary current source for passing the same amount of current as the pair of second current sources; a detection resistor having the same resistance value as the pair of resistors, and having the first and second secondary current sources connected to either end; and a second comparison circuit comparing a detection voltage generated at a connection point between the detection resistor and the second secondary current source by passing current by the first and second secondary current sources with a predetermined detection reference voltage, and the amounts of current of the second secondary current source and the pair of second current sources can be controlled such that the detection voltage matches the predetermined detection reference voltage based on a comparison result by the second comparison circuit.

With the configuration, the amount of current passed by the second current source can match the amount of current passed by the first current source.

At this time, the predetermined detection reference voltage can be predetermined at a voltage of a direct-current component of a signal input to the source follower circuit.

The configuration prevents a current from passing to or from the circuit at the preceding stage from which the source follower circuit receives a signal.

A semiconductor apparatus having the above-mentioned source follower circuit according to the present invention formed on a single semiconductor substrate also relates to the present invention.

The present invention can provide a source follower circuit having stable voltage level of an output direct-current component with the above-mentioned configuration.

BRIEF DESCRIPTION OF THE DRAWINGS

The present invention will be more apparent from the following detailed description when the accompanying drawings are referenced.

FIG. 2 shows the configuration of the first example of the source follower circuit embodying the present invention;

FIG. 3 shows the configuration of the second example of the source follower circuit embodying the present invention;

FIG. 4 shows the configuration of the third example of the source follower circuit embodying the present invention;

FIG. 6 shows the configuration of the fourth example of the source follower circuit embodying the present invention.

DESCRIPTION OF THE PREFERRED EMBODIMENTS

Figure 1:
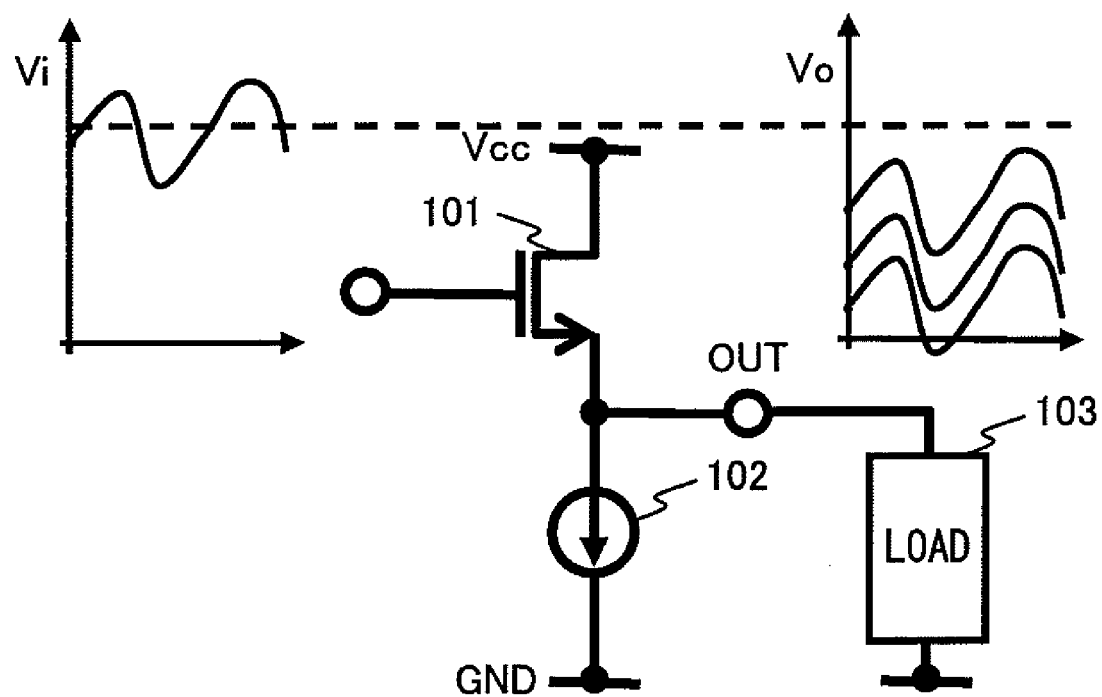
FIG. 1 shows an example of a circuit of a source follower.

The modes for embodying the present invention are described below with reference to the attached drawings.

First, FIG. 2 shows the configuration of the first example of the source follower circuit embodying the present invention. The circuit is a fully-differential circuit, monitors the output common mode direct-current voltage of a pair of source followers, and stabilizes the output common mode direct-current voltage by applying a negative feedback.

The circuit shown in FIG. 2 has each component formed on a single semiconductor substrate in a semiconductor apparatus 1.

In FIG. 2, transistors 11 and 21 are NMOS transistors, and a pair of source follower transistors configuring a source follower. Each drain of the transistors 11 and 21 is connected to the power line (voltage Vcc) of the circuit. Each source of the transistors 11 and 21 is connected to the ground line (reference potential GND) of the line through current sources 12 and 22.

In the output terminals of the source follower circuit, a non-inverting side output terminal OUTP is connected to the connection point of the transistor 11 and a current source 12, and an inverting side output terminal OUTM is connected to the connection point of the transistor 21 and a current source 22. In the input terminals of the source follower circuit, a non-inverting side input terminal INP is connected to the gate of the transistor 11 through a resistor 13, and an inverting side input terminal INM is connected to the gate of the transistor 21 through a resistor 23. The resistors 13 and 23 are a pair of resistors having the same resistance values.

Current sources 14 and 24 as a pair of first current sources, and current sources 15 and 25 as a pair of second current sources are connected to either end of the resistors 13 and 23. That is, the current source 14 is connected to the connection point of the resistor 13 and the gate of the transistor 11, and the current source 24 is connected to the connection point of the resistor 23 and the gate of the transistor 21. The current source 15 is connected to the connection point of the resistor 13 and the non-inverting side input terminal INP. The current source 25 is connected to the connection point of the resistor 23 and the inverting side input terminal INM. Therefore, a direct-current voltage is applied to the gate of the transistor 11 by the current sources 14 and 15 passing current to the resistor 13, and a direct-current voltage is applied to the gate of the transistor 21 by the current sources 24 and 25 passing current to the resistor 23.

The current sources 14 and 24 pass the same amount of current, and the current sources 15 and 25 pass the same amount of current. For this purpose, the current sources 14 and 24 and the current sources 15 and 25 are configured by, for example, a current mirror. The terminals opposite the connection side of the resistors 13 and 23 at the current sources 14 and 24 are connected to the power line of the circuit, and the terminals opposite the connection side of the resistors 13 and 23 at the current sources 15 and 25 are connected to the ground line of the circuit.

In the circuit shown in FIG. 2, the current sources 14 and 24 and the current sources 15 and 25 pass the same amount of current.

Resistors 16 and 26 have the same resistance value. One end of the resistor 16 is connected to the non-inverting side output terminal OUTP, and the other end is connected to one end of the resistor 26. The other end of the resistor 26 is connected to the inverting side output terminal OUTM. Therefore, a direct-current voltage (output common mode direct-current voltage) of a common mode component in the differential signal output from the non-inverting side output terminal OUTP and the inverting side output terminal OUTM is generated at the connection point of the resistors 16 and 26.

The output common mode direct-current voltage is applied to the inverting input terminal of an operational amplifier 31 as the first comparison circuit. A reference voltage V1 as a stable direct-current voltage is applied by a reference power supply 32 to the non-inverting input terminal of the operational amplifier 31, and the operational amplifier 31 compares the output common mode direct-current voltage with the reference voltage V1. The output signal of the operational amplifier 31 is output to each of the current sources 14, 15, 24, and 25 as a control signal for control of the amount of current passed by the current sources 14, 15, 24, and 25.

Described below is the operation of the circuit shown in FIG. 2.

Assume that a differential signal including a stable direct-current voltage component is input from a preceding stage of the circuit to the non-inverting side input terminal INP and the inverting side input terminal INM in the circuit shown in FIG. 2.

This differential signal is input to each gate of the transistors 11 and 21 through the resistors 13 and 23. Then, a signal of the same phase as the input signal (that is, non-inverting) is output from each source of the transistors 11 and 21, and is introduced to the non-inverting side output terminal OUTP and the inverting side output terminal OUTM. This differential output signal is added to both ends of the serial connection of the resistors 16 and 26.

Since the resistors 16 and 26 have the same resistance values, the common mode component of the differential output signal of the circuit shown in FIG. 2 is generated at the connection point between the resistors 16 and 26. The operational amplifier 31 compares the direct-current voltage of the common mode component of the differential output signal (output common mode direct-current voltage) with the reference voltage V1.

When the output common mode direct-current voltage is higher than the reference voltage V1, the operational amplifier 31 outputs a signal about this information (for example, a signal indicating a lower level than a predetermined threshold) as a control signal of the current sources 14, 15, 24, and 25. When the current sources 14, 15, 24, and 25 receive the control signal, they reduce the current value to be passed to reduce the current to be passed to the resistors 13 and 23, and reduce the direct-current voltage to be applied to each gate of the transistors 11 and 21. Then, the voltage at each source of the transistors 11 and 21 is reduced, thereby also reducing the output common mode direct-current voltage. Afterwards, the circuit becomes stable when the output common mode direct-current voltage matches the reference voltage V1.

On the other hand, when the output common mode direct-current voltage is lower than the reference voltage V1, the operational amplifier 31 outputs a signal about this information (for example, a signal indicating a higher level than the predetermined threshold) as a control signal of the current sources 14, 15, 24, and 25. When the current sources 14, 15, 24, and 25 receive the control signal, they raise the current value to be passed to increase the current to be passed to the resistors 13 and 23, and increase the direct-current voltage to be applied to each gate of the transistors 11 and 21. Then, the voltage at each source of the transistors 11 and 21 is raised, thereby also increasing the output common mode direct-current voltage. Afterwards, the circuit becomes stable when the output common mode direct-current voltage matches the reference voltage V1.

As described above, the operational amplifier 31 controls the amount of current to be passed to each of the pair of resistors 13 and 23 by the current sources 14, 15, 24, and 25 based on the result of the comparison between the output common mode direct-current voltage of the pair of the transistors 11 and 21 and the reference voltage V1, thereby controlling the applied voltage to each gate of the transistors 11 and 21 and performing the operation of matching the output common mode direct-current voltage with the reference voltage V1. As a result, the voltage level of the direct-current component of the differential signal output from the non-inverting side output terminal OUTP and the inverting side output terminal OUTM is stable at the reference voltage V1.

Described below is the configuration shown in FIG. 3. FIG. 3 shows the configuration of the second example of the source follower circuit embodying the present invention. In FIG. 3, the same component also shown in FIG. 2 is assigned the same reference numeral, and the detailed description is omitted here.

The configuration shown in FIG. 3 is different from the configuration shown in FIG. 2 only in that the resistors 13 and 14 are configured by transistors 17 and 27.

In FIG. 3, each drain and gate of the transistors 17 and 27 as NMOS transistors are connected to the current sources 14 and 24 as a pair of first current sources. Each source of the transistors 17 and 27 is connected to the current sources 15 and 25 as a pair of second current sources.

Like the circuit shown in FIG. 2, each component of the circuit shown in FIG. 3 is formed on a single semiconductor substrate. That is, the transistors 17 and 27 are formed on the same semiconductor substrate as the transistors 11 and 21 as a pair of source followers, so that the same production condition and operation temperature condition are applied, thereby substantially cooperating in the behavior of the fluctuation of the drain current caused by the conditions. Therefore, with the configuration shown in FIG. 3, the operation of the circuit can be more stable than with the configuration shown in FIG. 2.

Described below is the configuration shown in FIG. 4. FIG. 4 shows the configuration of the third example of the source follower circuit embodying the present invention. In FIG. 4, the same component also shown in FIG. 2 is also assigned the same reference numeral, and the detailed description is omitted here.

The configuration shown in FIG. 4 is different from the configuration shown in FIG. 2 in that current sources 34 and 35, and an operational amplifier 36 are added.

The resistor 33 has the same resistance value as the resistors 13 and 23, and the current source 34 as the first secondary current source and the current source 35 as the second secondary current source are connected to both ends of the resistor 33. The current source 34 passes the same amount of current as the current sources 14 and 24 as a pair of second current sources, and the current source 35 pass the same amount of current as the current sources 15 and 25 as the second secondary current sources. For the purpose, the current source 34 and the current sources 14 and 24, and the current source 35 and the current sources 15 and 25 are configured by, for example, a current mirror. The terminal opposite the connection side of the resistor 33 in the current source 34 is connected to the power line of the circuit, and the terminal opposite the connection side of the 33 in the current source 35 is connected to the ground line of the circuit.

The operational amplifier 31 is the same as the circuits shown in FIGS. 2 and 3 in that it controls the amount of current passed by the current sources 15 and 25 based on the result of the comparison between the output common mode direct-current voltage of the pair of transistors 11 and 21 and the reference voltage V1, but different in that it controls the amount of current passed by the current source 35 similarly as with the current sources 15 and 25, and does not control the amount of current passed by the current sources 14 and 24. The amount of current passed by the current sources 14 and 24 is controlled by the operational amplifier 36.

The non-inverting input terminal of the operational amplifier 36 as the second comparison circuit is connected to the connection point of the resistor 33 and the current source 35, and the voltage generated at this connection point (referred to as a "detection voltage") is applied. A detection reference voltage V2 as a stable direct-current voltage is applied by the reference power supply not shown in the attached drawings to the inverting input terminal of the operational amplifier 36. The operational amplifier 36 compares the detection voltage with the detection reference voltage V2. The output signal of the operational amplifier 36 is transmitted to each of the current sources 14, 24, and 34 as a control signal for control of the amount of current passed by the current sources 14, 24, and 34.

Described below is the operation of the circuit shown in FIG. 4.

Figure 5:
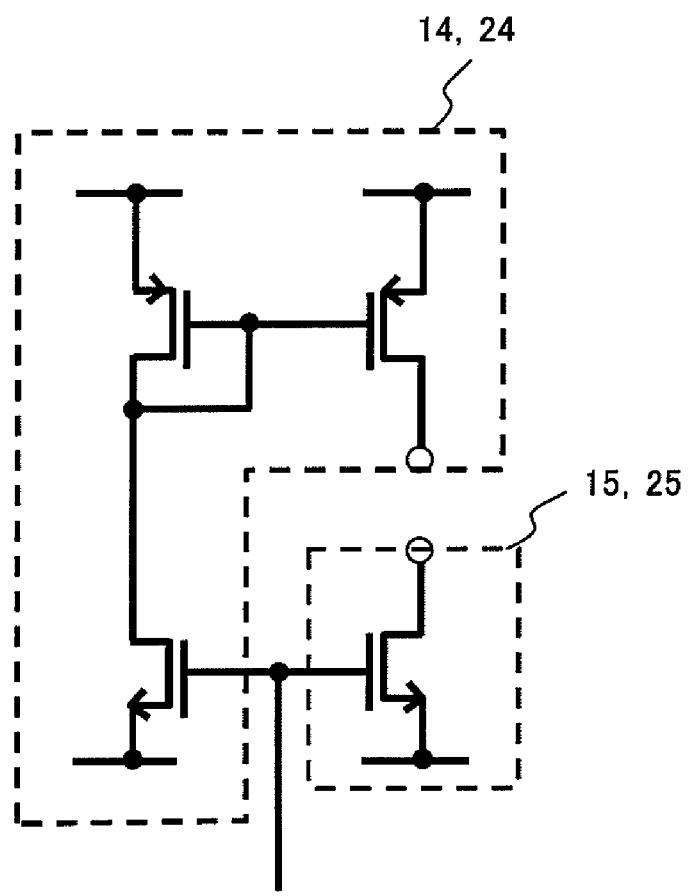
FIG. 5 shows an example of the configuration of the circuit for obtaining the same amount of current in each current source.

In the circuits shown in FIGS. 2 and 3, it is assumed that the current sources 14 and 24 and the current sources 15 and 25 pass the same amount of current. Each component of the circuit is formed on a single semiconductor substrate in the semiconductor apparatus 1, the current sources 14 and 24 on the power line side are generally configured using a P-type transistor, and the current sources 15 and 25 on the ground line side are configured using an N-type transistor. Although the current sources 14, 15, 24, and 25 are configured using a current mirror as shown in FIG. 5 to pass the same amount of current to the N-type and P-type transistors, it is not easy to constantly keep the same amount of current among the current sources 14 and 24 and the current sources 15 and 25 because the current ratio cannot be stable due to a finite resistance value of an output resistance Rds between the N-type and P-type transistors used for the current mirror.

If the amount of current is not the same between the current sources 14 and 24 and the current sources 15 and 25, current passes to and from the circuit at the preceding stage connected through the non-inverting side input terminal INP and the inverting side input terminal INM, thereby imposing a load on the circuit at the preceding stage by the current.

In the circuit shown in FIG. 4, a negative feedback is applied to stabilize the voltage at the detection reference voltage V2 in the non-inverting side input terminal INP and the inverting side input terminal INM in the circuit as described below.

As described above, the current source 35 is controlled based on the result of the comparison by the operational amplifier 31 between the output common mode direct-current voltage and the reference voltage V1, and the same amount of current as the current sources 15 and 25 passes. The current source 34 passes the same amount of current as the current sources 14 and 24, and the resistor 33 has the same resistance value as the resistors 13 and 23. Therefore, when the symmetry of the circuits among the serial connection among the resistor 33 and the current sources 34 and 35, the serial connection among the resistor 13 and the current sources 14 and 15, and the serial connection among the resistor 23 and the current sources 24 and 25 is considered, it is certain that the detection voltage generated by the current sources 34 and 35 passing the current through the resistor 33, which is the detection resistor, matches the voltage generated in the non-inverting side input terminal INP and the inverting side input terminal INM.

The operational amplifier 36 performs the operation of matching the detection voltage and the voltage of the non-inverting side input terminal INP and the inverting side input terminal INM generated in the circuit with the detection reference voltage V2 by controlling the amount of current passed by the current sources 14, 24, and 34 through the resistors 13, 23, and 33 based on the result of the comparison between the detection voltage and the detection reference voltage V2. As a result, the voltage level of the non-inverting side input terminal INP and the inverting side input terminal INM in the circuit does not fluctuate by the control of the amount of current passed by the current sources 14, 24, and 34 controlled by the operational amplifier 36.

Therefore, by setting in advance the detection reference voltage V2 as the voltage of the direct-current component of the signal applied to the non-inverting side input terminal INP and the inverting side input terminal INM in the circuit at the preceding stage, or by configuring the circuit at the preceding stage such that the voltage of the direct-current component of the signal applied to the non-inverting side input terminal INP and the inverting side input terminal INM can be the detection reference voltage V2, the current can be prevented from passing between the circuit shown in FIG. 4 and the circuit at the preceding stage, thereby reducing the load on the circuit at the preceding stage.

In the circuit shown in FIG. 4, the current source 34 as the first secondary current source can pass an amount of current proportional to the current sources 14 and 24 as the pair of first current source by a predetermined ratio, the current source 35 as the second secondary current source can pass an amount of current proportional to the current sources 15 and 25 as the pair of second current source by the predetermined ratio based on a comparison result by the operational amplifier 31 as the first comparison circuit, and the resistor 33 can have a resistance value inversely proportional to the resisters 13 and 23 by the predetermined ratio. With this configuration, the voltage at the non-inverting side input terminal INP and the inverting side input terminal INM in the circuit can match the detection reference voltage V2, thereby reducing the load on the circuit at the preceding stage.

In place of the circuit shown in FIG. 4, the operational amplifier 31 can control the current sources 14, 24, and 34 based on the comparison result between the output common mode direct-current voltage and the reference voltage V1, and the operational amplifier 36 can control the amount of current passed through the resistors 13, 23, and 33 by the current sources 15, 25 and 35 based on the result between the detection voltage and the detection reference voltage V2, as in the fourth example of the source follower circuit for embodying the present invention shown in FIG. 6. With this configuration, the voltage at the non-inverting side input terminal INP and the inverting side input terminal INM in the circuit can match the detection reference voltage V2, thereby reducing the load on the circuit at the preceding stage.

In the circuit shown in FIG. 6, the current source 34 can pass an amount of current proportional to the current sources 14 and 24 by a predetermined ratio, the current source 35 can pass an amount of current proportional to the current sources 15 and 25 by the predetermined ratio based on a comparison result by the operational amplifier 31, and the resistor 33 can have a resistance value inversely proportional to the resisters 13 and 23 by the predetermined ratio. With this configuration, the voltage at the non-inverting side input terminal INP and the inverting side input terminal INM in the circuit can match the detection reference voltage V2, thereby reducing the load on the circuit at the preceding stage.

The modes for embodying the present invention are described above, but the present invention is not limited to the above-mentioned modes, and can be improved and varied within the gist of the present invention.

What is claimed is:

1. A source follower circuit, comprising:
    a pair of source follower transistors;
    a voltage apply unit to apply a direct-current voltage to each gate of the pair of source follower transistors; and
    a control unit to control an applied voltage to each gate of the pair of source follower transistors by the voltage apply unit using a result of comparing an output common mode direct-current voltage of the pair of source follower transistors and a predetermined reference voltage so as to match the output common mode direct-current voltage with the reference voltage, wherein
    the voltage apply unit comprises:
        a pair of resistors respectively connected to gates of the pair of source follower transistors and having same resistance values; and
        a pair of current sources to pass a same amount of current, and
    the control unit is to control the amount of current to be passed by the pair of current sources to the pair of resistors respectively.

2. The circuit according to claim 1, wherein
the control unit comprises a comparison circuit to compare the output common mode direct-current voltage with the reference voltage, and controls the applied voltage using a comparison result by the comparison circuit.

3. The circuit according to claim 1, wherein
each of the pair of resistors is configured by a transistor.

4. The circuit according to claim 3, wherein
the transistor and the pair of source follower transistors are formed on a single semiconductor substrate.

5. The circuit according to claim 1, wherein
the pair of current sources comprises:
    a pair of first current sources to pass a same amount of current; and
    a pair of second current sources to pass a same amount of current,
    each of the pair of first current sources is connected to a connection point between each gate of the pair of source follower transistors and the pair of resistors,
    each of the pair of second current sources is connected each of the pair of resistors on an opposite side of a connection of the pair of first current sources, and
    the control unit controls an amount of current to be passed by each of the first and second current sources.

6. The circuit according to claim 5, wherein
the control unit comprises a first comparison circuit to compare the output common mode direct-current voltage and the reference voltage, and controls an amount of current passed by the second current source using a comparison result by the first comparison circuit, and
the control unit further comprises a secondary control unit to control an amount of current passed by the first current source so as to match the amount of current passed by the first current source with the amount of current passed by the second current source.

7. The circuit according to claim 6, wherein
a differential signal is input to the source follower circuit, and the differential signal is input to each of a connection point between the pair of resistors and second current sources,
the secondary control unit comprises:
    a first secondary current source to pass an amount of current proportional to the pair of first current source by a predetermined ratio;
    a second secondary current source to pass an amount of current proportional to the pair of second current source by the predetermined ratio using a comparison result by the first comparison circuit;
    a detection resistor having a resistance value inversely proportional to the pair of resistors by the predetermined ratio, and having the first and second secondary current sources connected to either end; and
    a second comparison circuit to compare a detection voltage generated at a connection point between the detection resistor and the second secondary current source by passing current by the first and second secondary current sources with a predetermined detection reference voltage, and amounts of current of the first secondary current source and the pair of first current sources are controlled such that the detection voltage matches the predetermined detection reference voltage using a comparison result by the second comparison circuit.

8. The circuit according to claim 6, wherein
a differential signal is input to the source follower circuit, and the differential signal is input to each of a connection point between the pair of resistors and second current sources,
the secondary control unit comprises:
  a first secondary current source to pass a same amount of current as the pair of first current sources;
  a second secondary current source to pass a same amount of current as the pair of second current sources based on a comparison result by the first comparison circuit;
  a detection resistor having a same resistance value as the pair of resistors, and having the first and second secondary current sources connected to either end; and
  a second comparison circuit to compare a detection voltage generated at a connection point between the detection resistor and the second secondary current source by passing current by the first and second secondary current sources with a predetermined detection reference voltage, and
amounts of current of the first secondary current source and the pair of first current sources are controlled such that the detection voltage matches the predetermined detection reference voltage using a comparison result by the second comparison circuit.

9. The circuit according to claim 5, wherein
the control unit comprises a first comparison circuit to compare the output common mode direct-current voltage and the reference voltage, and controls an amount of current passed by the first current source using a comparison result by the first comparison circuit, and
the control unit further comprises a secondary control unit to control an amount of current passed by the second current source so as to match the amount of current passed by the second current source with the amount of current passed by the first current source.

10. The circuit according to claim 9, wherein
a differential signal is input to the source follower circuit, the differential signal is input to each of a connection point between the pair of resistors and second current sources,
the secondary control unit comprises:
  a first secondary current source to pass an amount of current proportional to the pair of first current source by a predetermined ratio using a comparison result by the first comparison circuit;
  a second secondary current source to pass an amount of current proportional to the pair of second current source by the predetermined ratio;
  a detection resistor having a resistance value inversely proportional to the pair of resistors by the predetermined ratio, and having the first and second secondary current sources connected to either end; and
  a second comparison circuit to compare a detection voltage generated at a connection point between the detection resistor and the second secondary current source by passing current by the first and second secondary current sources with a predetermined detection reference voltage, and
amounts of current of the second secondary current source and the pair of second current sources are controlled such that the detection voltage matches the predetermined detection reference voltage using a comparison result by the second comparison circuit.

11. The circuit according to claim 9, wherein
a differential signal is input to the source follower circuit, the differential signal is input to each of a connection point between the pair of resistors and second current sources,
the secondary control unit comprises:
  a first secondary current source to pass a same amount of current as the pair of first current sources using a comparison result by the first comparison circuit;
  a second secondary current source to pass a same amount of current as the pair of second current sources;
  a detection resistor having a same resistance value as the pair of resistors, and having the first and second secondary current sources connected to either end; and
  a second comparison circuit to compare a detection voltage generated at a connection point between the detection resistor and the second secondary current source by passing current by the first and second secondary current sources with a predetermined detection reference voltage, and
amounts of current of the second secondary current source and the pair of second current sources are controlled such that the detection voltage matches the predetermined detection reference voltage using a comparison result by the second comparison circuit.

12. The circuit according to claim 8, wherein
the predetermined detection reference voltage is predetermined at a voltage of a direct-current component of a signal input to the source follower circuit.

13. The circuit according to claim 11, wherein
the predetermined detection reference voltage is predetermined at a voltage of a direct-current component of a signal input to the source follower circuit.

14. A semiconductor including a source follower circuit formed on a single semiconductor substrate, the source follower circuit comprising:
  a pair of source follower transistors;
  a voltage apply unit to apply a direct-current voltage to each gate of the pair of source follower transistors; and
  a control unit to control an applied voltage to each gate of the pair of source follower transistors by the voltage apply unit using a result of comparing an output common mode direct-current voltage of the pair of source follower transistors and a predetermined reference voltage so as to match the output common mode direct-current voltage with the reference voltage, wherein
the voltage apply unit comprises:
  a pair of resistors respectively connected to gates of the pair of source follower transistors and having same resistance values; and
  a pair of current sources to pass a same amount of current, and
the control unit is to control the amount of current to be passed by the pair of current sources to the pair of resistors respectively.

15. The semiconductor according to claim 14, wherein
each of the pair of resistors is configured by a transistor.

16. The semiconductor according to claim 15, wherein
the transistor and the pair of source follower transistors are formed on a single semiconductor substrate.

17. The semiconductor according to claim 14, wherein
the pair of current sources comprises:
  a pair of first current sources to pass a same amount of current; and a pair of second current sources to pass a same amount of current, each of the pair of first current sources is connected to a connection point between each gate of the pair of source follower transistors and the pair of resistors, each of the pair of second current sources is connected each of the pair of resistors on an opposite side of a connection of the pair of first current sources, and the control unit controls an amount of current to be passed by each of the first and second current sources.

18. The semiconductor according to claim 17, wherein
the control unit comprises a first comparison circuit to compare the output common mode direct-current voltage and the reference voltage, and controls an amount of current passed by the second current source using a comparison result by the first comparison circuit, and the control unit further comprises a secondary control unit to control an amount of current passed by the first current source so as to match the amount of current passed by the first current source with the amount of current passed by the second current source.

19. The semiconductor according to claim 18, wherein
a differential signal is input to the source follower circuit, and the differential signal is input to each of a connection point between the pair of resistors and second current sources, the secondary control unit comprises:

a first secondary current source to pass an amount of current proportional to the pair of first current source by a predetermined ratio;

a second secondary current source to pass an amount of current proportional to the pair of second current source by the predetermined ratio using a comparison result by the first comparison circuit;

a detection resistor having a resistance value inversely proportional to the pair of resistors by the predetermined ratio, and having the first and second secondary current sources connected to either end; and a second comparison circuit to compare a detection voltage generated at a connection point between the detection resistor and the second secondary current source by passing current by the first and second secondary current sources with a predetermined detection reference voltage, and amounts of current of the first secondary current source and the pair of first current sources are controlled such that the detection voltage matches the predetermined detection reference voltage using a comparison result by the second comparison circuit.

* * * * *